US012802922B2

(12) United States Patent
Kornfeld et al.

(10) Patent No.: US 12,802,922 B2
(45) Date of Patent: Nov. 17, 2026

(54) METHOD FOR AUTOMATIC FOCUSING AND ASTIGMATISM CORRECTION FOR AN ELECTRON MICROSCOPE

(71) Applicant: MAX-PLANCK-GESELLSCHAFT ZUR FÖRDERUNG DER WISSENSCHAFTEN E.V., Munich (DE)

(72) Inventors: Jörgen Kornfeld, Stockdorf (DE); Philipp Schubert, Puchheim (DE)

(73) Assignee: MAX-PLANCK-GESELLSCHAFT ZUR FÖRDERUNG DER WISSENSCHAFTEN E.V., Munich (DE)

( * ) Notice: Subject to any disclaimer, the term of this patent is extended or adjusted under 35 U.S.C. 154(b) by 275 days.

(21) Appl. No.: 18/714,455

(22) PCT Filed: Nov. 30, 2022

(86) PCT No.: PCT/EP2022/083891
§ 371 (c)(1),
(2) Date: May 29, 2024

(87) PCT Pub. No.: WO2023/099584
PCT Pub. Date: Jun. 8, 2023

(65) Prior Publication Data

US 2025/0174427 A1 May 29, 2025

(30) Foreign Application Priority Data

Dec. 2, 2021 (EP) .................................... 21212051

(51) Int. Cl.
*H01J 37/21* (2006.01)
*H01J 37/153* (2006.01)

(52) U.S. Cl.
CPC ............ *H01J 37/21* (2013.01); *H01J 37/153* (2013.01); *H01J 2237/1532* (2013.01); *H01J 2237/216* (2013.01); *H01J 2237/221* (2013.01)

(58) Field of Classification Search
CPC ........ H01J 37/21; H01J 37/153; H01J 37/222; H01J 37/244; H01J 37/285;
(Continued)

(56) References Cited

U.S. PATENT DOCUMENTS 7,863,564 B2 * 1/2011 Tsuneta .................. H01J 37/20 250/397
11,626,267 B2 * 4/2023 Zur ...................... H01J 37/244 250/311

(Continued)

FOREIGN PATENT DOCUMENTS

WO WO 2021/234035 A2 11/2021

OTHER PUBLICATIONS

Dastidar (Jun. 2019) "Automated Focus Distance Estimation for Digital Microscopy Using Deep Convolutional Neural Networks," IEEE/CVF Conference on Computer Vision and Pattern Recognition Workshops (CVPRW), IEEE, Jun. 16, 2019 (Jun. 16, 2019), pp. 1049-1056.

(Continued)

*Primary Examiner* — Tung X Le
(74) *Attorney, Agent, or Firm* — LEYDIG, VOIT & MAYER, LTD.

(57) ABSTRACT

Method for automatic focusing and astigmatism correction for a specific microscope setup, in particular an electron microscope, the microscope being at least adjustable in microscope parameters a working distance, a stigmator in a x-direction and a stigmator in a y-direction, the method comprising the steps: a) capturing a first image of a sample with a first working distance perturbation and capturing a
(Continued)

Figure 1:
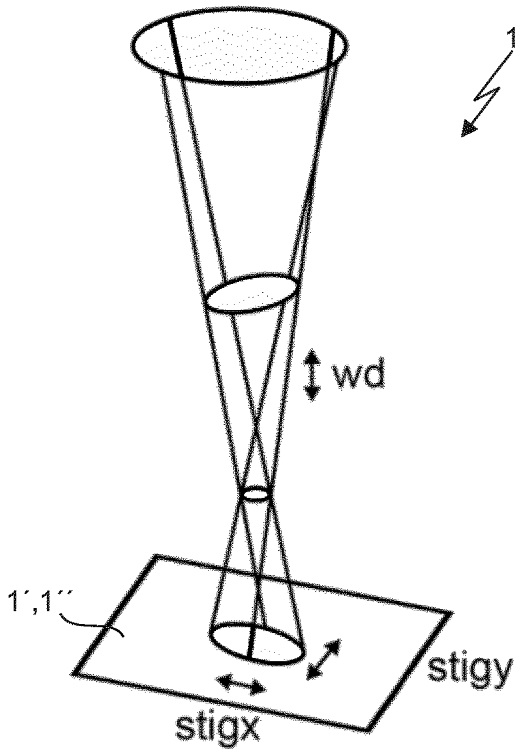

second image of the sample with a second working distance perturbation around a current working distance and current stigmator settings; b) selecting n subareas of the first image and n subareas of the second image, n≥1, wherein an i-th subarea of the first image and an i-th subarea of the second image form an i-th input patch pair, 1≤i≤n; c) processing each i-th input patch pair and receiving an i-th correction term comprising a correction to the current working distance, stigmator in x-direction and stigmator in y-direction; d) receiving an output correction term as a function of all the correction terms; e) adjusting the current working distance and stigmator settings by applying the output correction term to the current working distance and stigmator settings.

20 Claims, 5 Drawing Sheets

(58) Field of Classification Search
CPC ........... H01J 2237/216; H01J 2237/221; H01J 2237/1532; G06T 5/80
See application file for complete search history.

(56) References Cited

U.S. PATENT DOCUMENTS 12,056,865 B2 * 8/2024 Klochkov ............. G06T 7/0004
12,073,541 B2 * 8/2024 Otwinowski ............. G06T 5/80
2008/0210867 A1 * 9/2008 Hitomi .................... H01J 37/28 250/311
2009/0314938 A1 12/2009 Sato et al.
2014/0353500 A1 * 12/2014 Tsuneta ................... H01J 37/26 250/311
2016/0013015 A1 * 1/2016 Potocek ............... G02B 21/008 250/307
2017/0018396 A1 * 1/2017 Sintorn ................. H01J 37/153
2021/0272767 A1 * 9/2021 Bischoff ............. H01J 37/1471

OTHER PUBLICATIONS

Dastidar et al. (Dec. 2019) "Whole slide imaging system using deep learning-based automated focusing", Biomedical Optics Express, vol. 11, No. 1, Dec. 23, 2019 (Dec. 23, 2019), p. 480.

International Search Report and Written Opinion, dated Feb. 22, 2023, corresponding to International Application No. PCT/EP2022/083891, (from which the present application claims priority,) 27 pp.

Ivanov et al. (Aug. 2020) "DeepFocus: a deep learning model for focusing microscope systems", SPIE Proceedings; [Proceedings of SPIE ISSN 0277-786X], SPIE, US, vol. 11511, Aug. 20, 2020 (Aug. 20, 2020), pp. 1151103-1151103.

Lee et al. (Dec. 2021) "Robust autofocusing for scanning electron microscopy based on a dual deep learning network", Scientific Reports, vol. 11, No. 1, Dec. 1, 2021 (Dec. 1, 2021), pp. 1-12.

Rudnaya et al. (2011) "A Derivative-Based Fast Autofocus Method in Electron Microscopy", Journal of Mathematical Imaging and Vision, Kluwer Academic Publishers, BO, vol. 44, No. 1, Aug. 12, 2011 (Aug. 12, 2011), pp. 38-51.

* cited by examiner

METHOD FOR AUTOMATIC FOCUSING AND ASTIGMATISM CORRECTION FOR AN ELECTRON MICROSCOPE

CROSS-REFERENCE TO RELATED APPLICATIONS

This application is a U.S. National Stage Application filed under 35U.S.C. § 371 of International Application No. PCT/EP2022/083891, filed Nov. 30, 2022, which claims the benefit of European Application No. 21212051.3, filed Dec. 2, 2021. All of these applications are hereby incorporated by reference in their entireties.

The invention relates to a method for automatic focusing and astigmatism correction for a microscope.

In the case of microscopy, in particular electron microscopy, the parameters of the microscope, in particular the parameters regarding image quality, are often controlled manually, that is by the user of the microscope. However, adjusting the parameters for every probe may be a very time-consuming process.

As an improvement, electron microscopy may rely on automation and control algorithms to ensure a higher image quality with minimal human intervention.

However, currently used focus and astigmatism correction algorithms usually try to explicitly model image formation and subsequently aberration correction, and many suffer from long processing times, as well as problematic generalization to untested settings.

The high resolution of electron microscopy (EM), and the ability to image every sample detail remain unrivaled. A key component of automated EM is to maintain high-quality images over the entire acquisition process, which can involve millions of individual images and operations over long periods. This makes manual microscope parameter adjustments largely impossible. Tight constraints on algorithm execution time budgets, aberration correction convergence speeds and low-electron dose budgets to avoid sample artefacts pose a great challenge to automatic defocus and astigmatism correction algorithms despite their necessity, especially in high-throughput electron microscopy.

Existing solutions in the area of scanning electron microscopy (SEM) are usually based on explicit physical models of the electron beam and its interaction with the sample. Measurements, in this case images, with known perturbations are taken, followed by focus and stigmation parameter inference to estimate the wavefront aberrations. While such physically grounded approaches should lead in theory to excellent generalization properties, that is the ability to operate successfully on different microscopes or samples with no or minimal or adaptations, they contain in practice many parameters that require careful tuning.

Here, a method is introduced which is mainly a data-driven method for aberration correction in scanning electron microscopy, wherein the method works in very low signal-to-noise ratio conditions, reduces processing times by more than an order-of-magnitude in comparison to the state of the art, rapidly converges in a large aberration range, and can be recalibrated to different microscopes or challenging samples in an automated fashion by non-experts.

In particular, a machine-learning based focusing and stigmation correction method for scanning electron microscopy. The proposed algorithm has nearly instant inference time, rapid convergence, operates on low-electron dose noisy images and has a ready-to-use procedure to re-calibrate it to novel machines and samples without requiring expert knowledge, guaranteeing convergence in all usage scenarios.

The object of the invention is to provide a method for automatic focus and astigmatism correction for electron microscopy, wherein the method is fast and robust when used.

The problem is solved by the methods provided herein. A method for generating training data of a machine-learning modeling model used for a microscope setup is also provided. Also, the problem is solved by a computing system as described herein.

According to the invention, provided is a method for automatic focusing and astigmatism correction for a specific microscope setup, in particular an electron microscope. The microscope being at least adjustable in the following microscope parameters, a working distance, a stigmator in a x-direction and a stigmator in a y-direction, and with the method comprising the steps:

a) capturing a first image of a sample with a first working distance perturbation and capturing a second image of the sample with a second working distance perturbation around a current working distance and current stigmator setting;
b) selecting n subareas of the first image and n subareas of the second image, $n \geq 1$, wherein an i-th subarea of the first image and an i-th subarea of the second image form an i-th input patch pair, $1 \leq i \leq n$;
c) processing each i-th input patch pair and receiving an i-th correction term comprising a correction to the current working distance, stigmator in x-direction and stigmator in y-direction;
d) receiving an output correction term as a function of all the correction terms;
e) adjusting the current working distance and stigmator settings by applying the output correction term to the current working distance and stigmator settings.

In general, the image of a flat specimen or sample in a microscope, in particular a scanning electron microscope is optimally captured when the size of the spot of the electron beam is below the sampling distance. Commonly, three parameters, which are the working distance, and orthogonal stigmators, herein referred to as stig x and stig y, can be adjusted by electron microscope operators to directly control the spot shape and bring it below the pixel size at the beam-specimen interaction point, leading consequently to sharp image formation.

Advantageously, the microscope or the microscope setup may be a scanning electron microscope (SEM) or an environmental scanning electron microscope (ESEM). It may also be a scanning transmission electron microscope (STEM) or a transmission electron microscope (TEM), albeit with a different image formation principle, meaning that instead of the parameters working distance and stigmator settings additionally or alternatively different microscope parameters have to be controlled.

The method as proposed has, as an input, two images each with a known working distance perturbation around the current microscope working distance and stigmator settings; the current working distance and stigmator settings are relating to a specific image which may be taken by the microscope. It is noted that the current working distance and stigmator settings provide an image of the sample which is typically out-of-focus.

Further, the method requires at least two perturbed test images to allow the retrieval of magnitude and direction of the correction term. According to a preferred embodiment, the correction term comprises a correction direction.

According to the preferred embodiments of the invention, the perturbations may be of different type with respect to each other. In particular, the first perturbation and the second perturbation are either both positive perturbations or both negative perturbations, or the first perturbation is a positive perturbation, and the second perturbation is a negative perturbation.

Further preferably, an absolute value of the first perturbation and the second perturbation are either identical or different to each other. In particular, the perturbations have preferably the same absolute value when one perturbation is positive and the other one is negative. However, it may be the case that one perturbation is positive and the other one is negative, the perturbations having different absolute values. In the case of one perturbation being positive and the other one being negative, the important fact is that these perturbations lead to an asymmetry with respect to a sharpness of the subareas of the image pairs, meaning that one subarea of an image patch pair is sharper than the other, thereby resulting in a correction direction of the correction term. In the case of an in-focus initial setting and an antisymmetric perturbation in the working distance parameter, the test images inherit the same blur distortions (due to the symmetry of pure defocus). For an initial setting that is out-of focus, the asymmetry in distortion of the test images can be exploited by the method to infer a correction vector towards in-focus parameter settings (working distance and stigmator settings).

The asymmetry should still be exploitable if the perturbations have the same sign, meaning both perturbations are positive or negative. However, if both perturbations have the same sign, the absolute values of the perturbations have to be different from each other. If the perturbations had the same absolute value, no direction would be conceivable since no image patch pair could be formed because the same perturbed image is captured twice.

However, there are some requirements to the perturbations in view of the present invention. First, it is noted that the invention is not limited to two perturbations; in fact, it may be the case that multiple perturbations are used, with a total number greater than two. Preferably, the total number of perturbations is constant, and more preferably preset, for the inventive method. Moreover, it is possible that the magnitude and the direction are constant as well. The direction may be given by the signs of the perturbations.

Moreover, the absolute values of the perturbations have to be comparable to the target parameter range, meaning that the order of magnitude of the perturbations is comparable or less than the order of magnitude of the correction of the working distance and stigmator settings. Furthermore, the perturbations should be sufficiently different with respect to the target parameter range.

According to a preferred embodiment of the invention, the sizes of the i-th subarea of the first image and the i-th subarea of the second image are substantially identical. In the sense of the present invention, "substantially" relates to a difference in size by at most 10%, preferably 5%, of the size of the respective subarea. Most preferably, the sizes of the i-th subareas are identical. As an example, the test image size may be 1024×768 with a pixel size of 10 nm, wherein the size of a subarea may be a square with 512×512 or 256×256 or even 128×128, wherein further sizes may be possible. However, it was found that a smaller size of the subareas may result in lower convergence speeds. It is to be understood that the size of the image, the pixel size and the size of the subareas can have different values than the values presented. However, it should be understood that the size of a subarea is smaller than the size of the whole image.

According to a further preferred embodiment, the position of the i-th subarea of the first image with respect to the first image being is either substantially identical or different to the i-th subarea of the second image with respect to the second image.

According to further preferred embodiment of the invention, the i-th subarea of the first image and the (i+1)-th subarea of the first image may overlap partially. However, it may also be possible that the subareas do not overlap, or only a part of the subareas overlap. This is due to the fact that the subarea may be selected randomly and independently.

According to a further preferred embodiment of the invention the output correction term is a return value of a function. More preferably, the function is combining all i-th correction terms into one output correction term.

As an example, as such a function may be considered a mean value of all the correction terms; or a median of all the correction terms. Further alternatively the function may be a computer function, such as for example the RANSAC algorithm or the like, which are highly robust with respect to outliers.

According to a further preferred embodiment of the invention, the method steps a)-e) are repeated at least once. Advantageously, the method is stopped when a termination condition is met.

Preferably, the termination condition may be an absolute difference between the current working distance and stigmator settings and the adjusted working distance and stigmator settings with the absolute difference smaller than a first threshold. Also, preferably the termination condition is a sharpness indication indicating a sharpness of the image with the sharpness indication exceeding a second threshold; or preferably and after a predefined number of repetitions of method steps a)-e). It may be the case that the termination condition is a combination of the presented possibilities to further specify the termination condition.

During development of the inventive method, it could be shown that typically the method converges after three or four iteration steps, that is repetitions of the method.

According to a further preferred embodiment of the invention, method step c) is carried out by using a machine-learning modeling method with machine-learning modeling method settings. Advantageously, the machine-learning modeling method is a deep learning method. Preferably, at least one machine-learning modeling method setting are the weights of the machine-learning modeling method.

The machine-learning modeling method receives as an input the multiple input patch pairs and uses adjustable weights to transform the inputs into one correction term to the working distance and stigmator settings. The machine-learning modeling method preferably comprises a sequence of convolutional and fully connected layers for a non-linear feature extraction of the inputs and transformation to the target domain.

According to a further preferred embodiment of the invention, the machine-learning modeling method weights the i-th output term to each i-th input patch pair with an i-th weighting factor, the i-th weighting factor depending on a by the machine-learning modeling model predicted importance of the i-th input patch pair on the final output correction term.

During the method development, it was noticed that specimen or samples may contain regions or areas with little usable information for an auto-focus algorithm, such as blood vessels in tissue, which show only blank epoxy resin of a sample holder, but no contrast that could be used by an AF algorithm and thereby lead to suboptimal results. Therefore, it was reasoned that these areas should have less weight in any auto focus determination, which was realized by incorporating the i-th weighting factor into the architecture that leads to a new set of outputs of the method to independently weigh each auto focus estimate. These new method outputs are loosely regularized scores, preferably only in terms of weight decay, that are used as weighting factors already during machine-learning model training.

Two different granularities for weighting were tested, first on the level of the input image patches, which are the crops of the larger input image pair acquired by the microscope, and second on the level of individual pixels, leading to a scoring of every location in an input image. Both approaches were more robust toward specimen regions with little contrast information, illustrating that the method does not require conventional image processing to prefilter low contrast regions.

As an example, the output of the processing step is still a correction term which has been extended by the weighing factor:

$$\Delta F_i=(\Delta_{i,wd},\Delta_{i,stigx},\Delta_{i,stigy},s_i)$$

which can be processed to the output correction term:

$$\Delta F = \frac{\sum_i s_i \Delta F_i}{\sum_i s_i}$$

According to a preferred embodiment, the training method comprising the steps of:

i) capturing an in-focus image with known working distance and stigmator settings;
ii) for k out-of-focus parameter settings, storing the parameter settings and the set of perturbed test images (e.g. two for each out-of-focus parameter setting in the case of antisymmetric perturbation of the working distance);
iii) repeating steps i) and ii) for different subareas of the sample j times, generating a total of j times k image pairs used as training input to the model together with the known out-of-focus parameters as the target;
iv) processing and comparing the correction terms to the known working distance and stigmator settings and obtaining a comparative error, and, depending on the comparative error, adjusting the machine-learning modeling method settings iteratively where every iteration uses only a subset of the j times k training samples.

In particular, the weights of the machine-learning modeling method are adjusted, in particular by using a backpropagation method.

Also, it may be possible to use other techniques/methods than a backpropagation method or even a combination of different methods.

It is noted that the training method described above results in a model specialized on the microscope that was used for the training data generation.

However, it may be the case that a transfer to a different microscope setup with vastly different imaging settings, such as landing energy, beam current, overall working distance range, rotated image acquisition, may lead the method to failure and divergence instead of convergence.

Therefore, a method for generating training data for a machine-learning modeling model is presented, which is independent of the microscope setup and the microscope settings.

Method for generating training data of a machine-learning modeling model used for a microscope setup, in particular an electron microscope, wherein the method is independent of the microscope setup and microscope settings, the microscope being at least adjustable in the following microscope parameters, a working distance, a stigmator in a x-direction and a stigmator in a y-direction, the method comprising the steps:

a) capturing a single in-focus image of a sample with reference working distance and stigmator settings, and assigning a first score value to the single in-focus image, the first score value representing a sharpness of the in-focus image;
b) for a L-th location of the sample, with L=1, generating N out-of-focus images to obtain corresponding score values for each of the out-of-focus images and obtaining a directed correction term by using an optimization method;
c) adjusting the working distance and stigmator settings of the L-th location of the sample by applying the directed correction term to the working distance and stigmator settings and obtaining a new image with corresponding new working distance and stigmator settings and a score value associated to the obtained image;
d) obtaining a directed correction term from the optimization method using the score value and the new working distance and stigmator settings;
e) repeating steps c)-d) until the score value of the obtained image is below or substantially equal to the first score value to obtain reference working distance and stigmator settings;
f) Based on obtained reference working distance and stigmator settings, acquiring M out-of-focus image pairs together with the out-of-focus parameters;
g) changing the L-th location of the sample by moving the sample in x-and y-direction;
h) repeating the steps b)-g) with incrementing L with every repetition.

According to the method for generating the training data, images are obtained based on a movement of the sample only in x-direction and y-direction.

According to a further preferred embodiment of the invention, the optimization method is a classical optimization. An example for an optimization method may be a simplex method or a downhill-simplex method. The advantage of such downhill-simplex method is that it is a very robust and simple. The disadvantage may be the slow convergence speed; however, the method for generating training data creates a minimal set of training data for the new microscope setup such that the presented method for autofocusing is tuned correctly to the new microscope setup such that the method for autofocusing is converging based on the set of training data.

Further, the presented method for generating training data uses the score value representing the sharpness of an image, wherein the score value is directionless and therefore independent of the microscope setup parameters, except for a scaling factor. The scale is taken into account by adjusting the termination threshold according to a).

Further advantages, aims and properties of the present invention will be described by way of the appended drawings and the following description.

Figure 2:
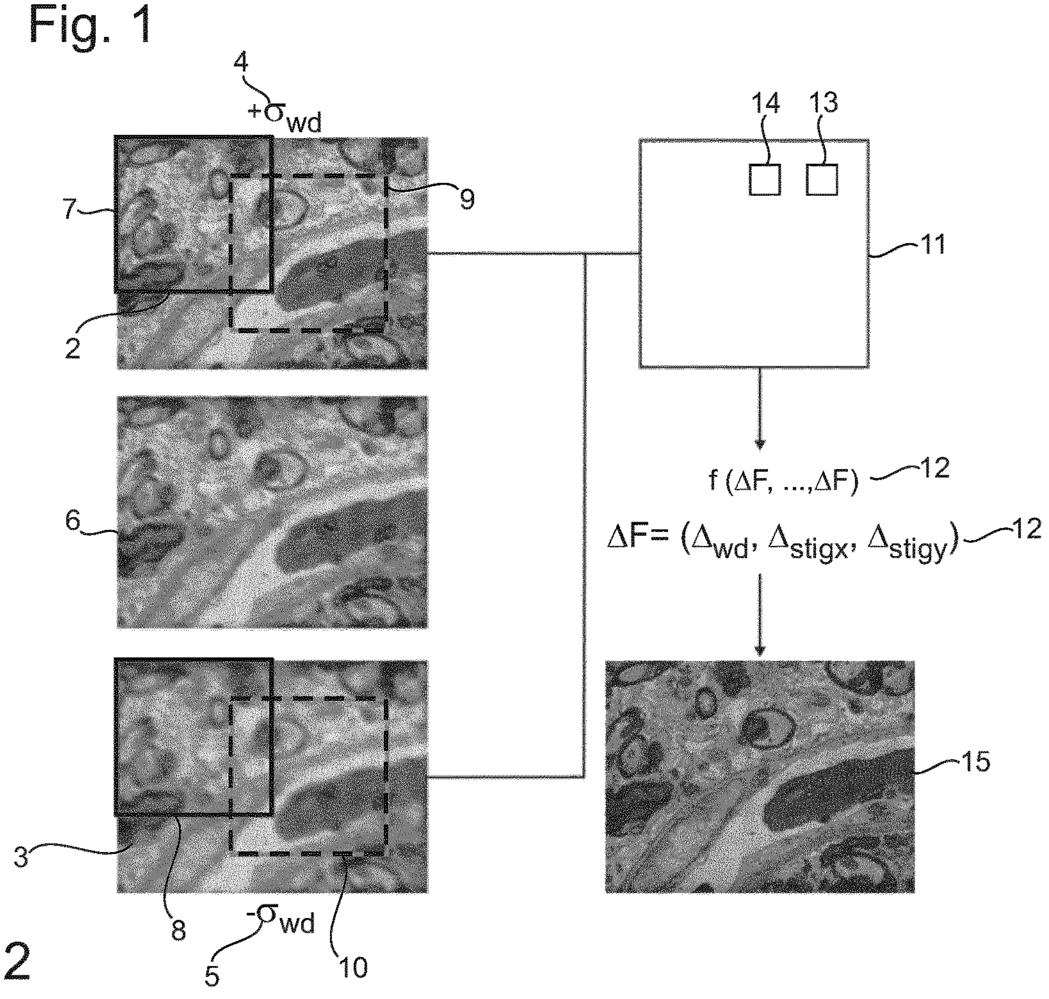
Figure 3:
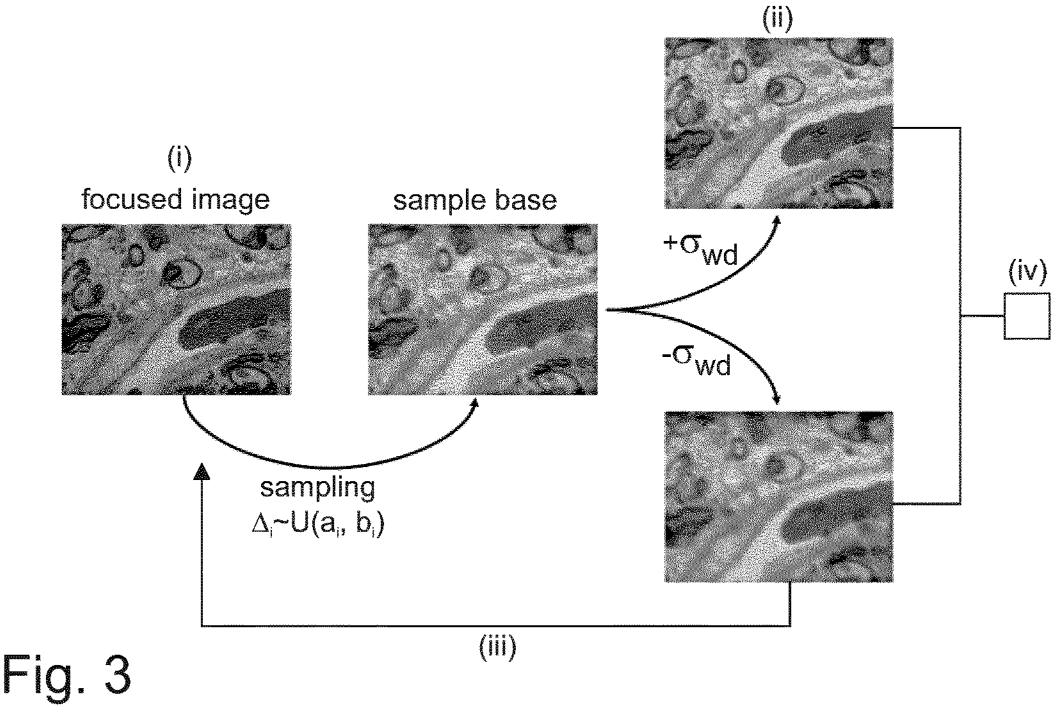
Figure 4A:
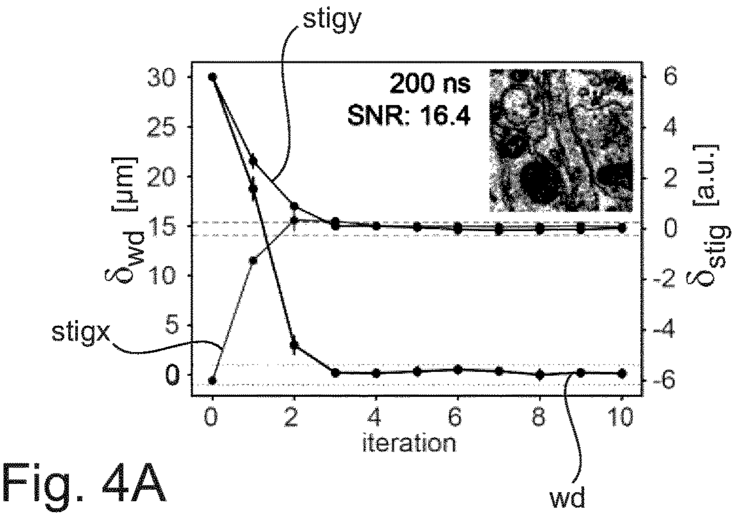
Figure 4B:
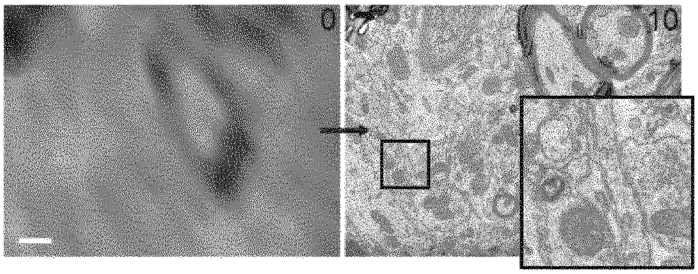
Figure 4C:
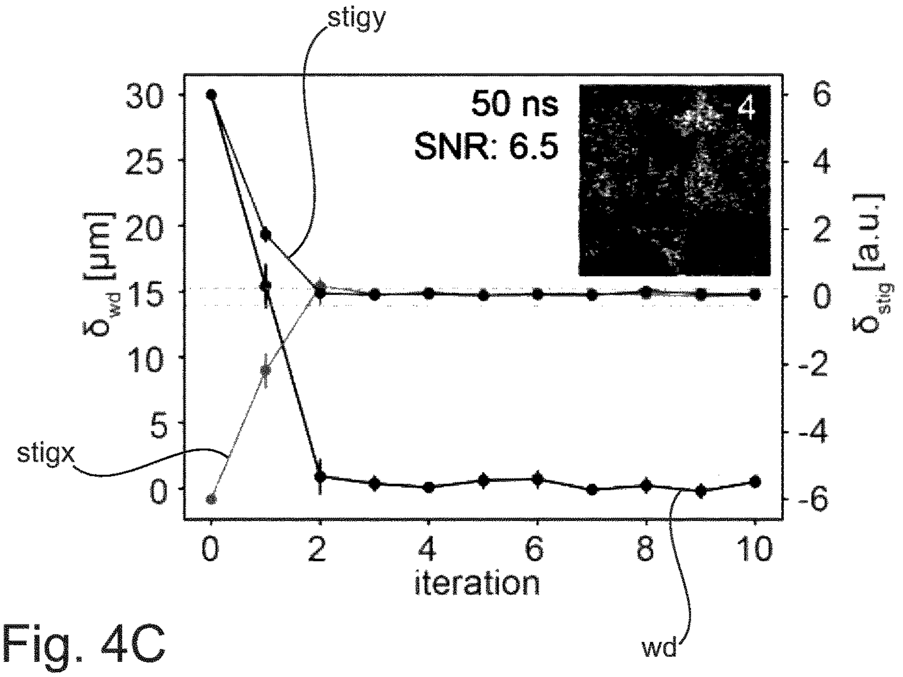
Figure 4D:
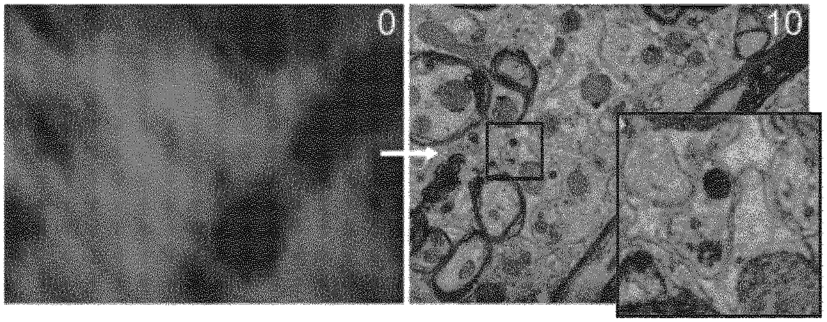
Figure 5:
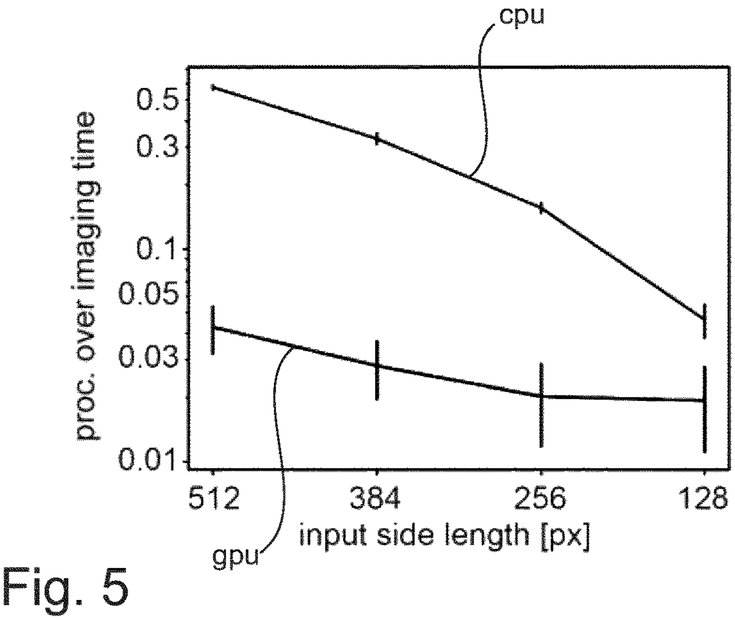
Figure 6A:
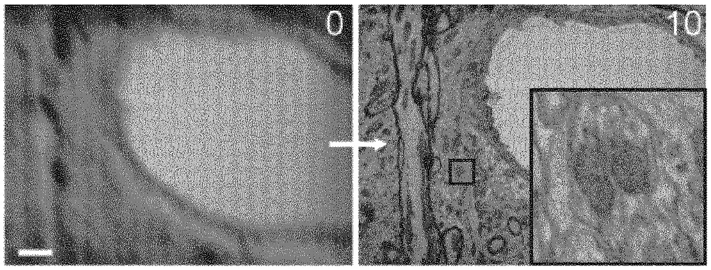
Figure 6B:
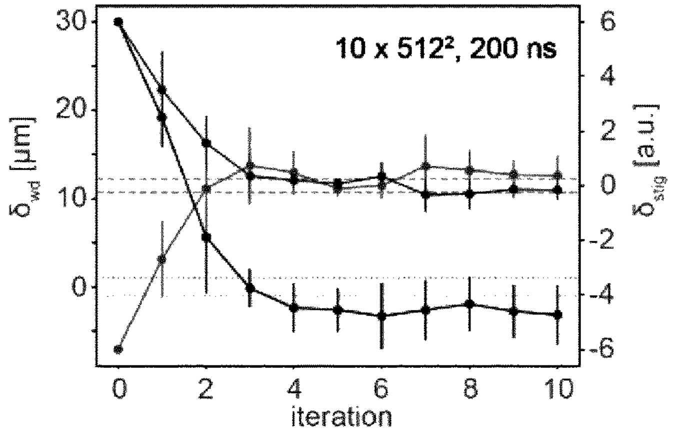
Figure 6C:
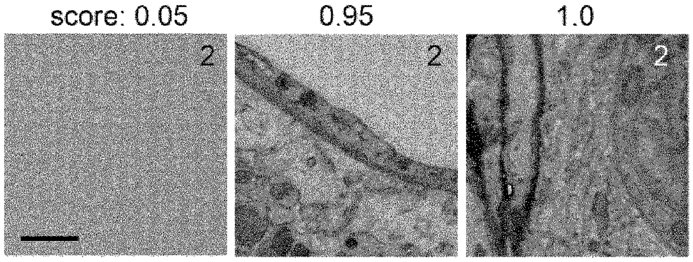
Figure 7A:
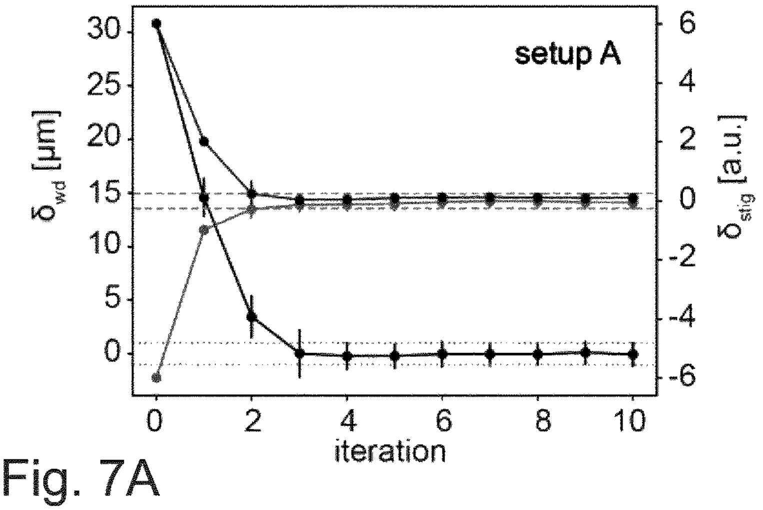
Figure 7B:
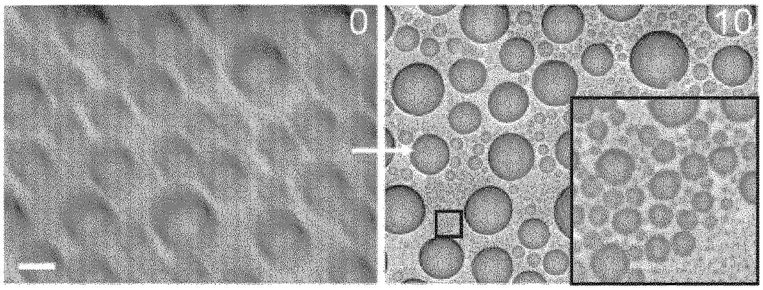
Figure 7C:
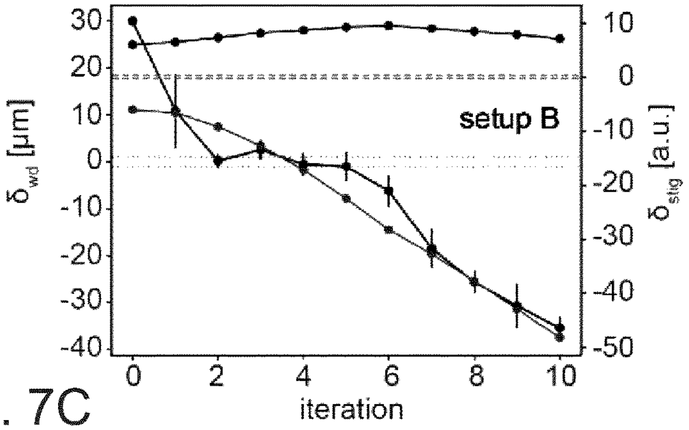
Figure 7D:
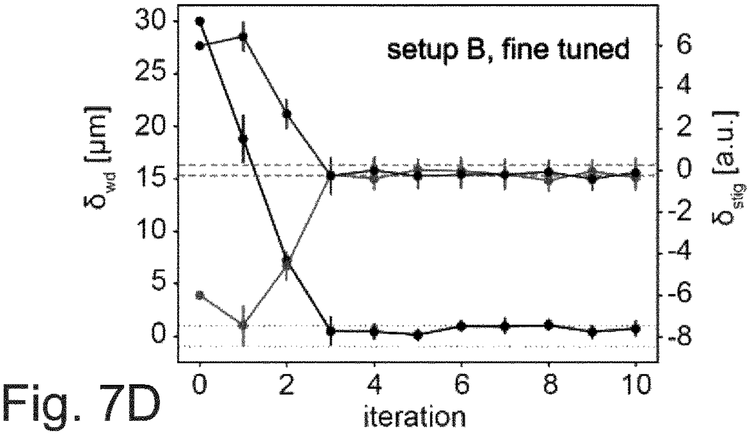

In the drawings:

FIG. 1 shows an exemplary microscope setup;

FIG. 2 brief overview of the autofocus method;

FIG. 3 shows a method for generating training data;

FIG. 4A convergence plot with a dwell time of 200 ns;

FIG. 4B acquired image according to the convergence plot of FIG. 4A;

FIG. 4C convergence plot with a dwell time of 50 ns;

FIG. 4D acquired image according to the convergence plot of FIG. 4C;

FIG. 5 presentation of the processing time;

FIG. 6A sample containing regions with little usable information for an auto-focus algorithm;

FIG. 6B convergence plot of FIG. 6A;

FIG. 6C crops of the image patches together with the corresponding score;

FIG. 6D score map;

FIG. 7A convergence plot of the method according to the invention on the specific microscope;

FIG. 7B autofocusing an image;

FIG. 7C convergence plot of the method according to the invention on a different microscope;

FIG. 7D convergence plot of the method according to the invention on the different microscope after tuning.

In general, the image of a flat specimen in a microscope setup 1, preferably a scanning electron microscope, is optimally captured when the size of the spot of the electron beam is below the sampling distance. Also, the microscope setup 1 comprises a sample holder 1' on which a sample 1" can be arranged.

Commonly, three parameters of the microscope setup 1, namely working distance wd and orthogonal stigmators stigx, stigy, hereinafter also referred to as stigmator in x-direction and y-direction, can be adjusted by microscope operators to directly control the spot shape of the electron beam and bring it below the pixel size at the beam-specimen interaction point, leading consequently to sharp image formation.

In FIG. 1, the three parameters wd, stigx, stigy of the microscope setup 1 are briefly shown.

The method according to the invention, as briefly shown in FIG. 2, takes as an input two images 2, 3 with a known working distance perturbation 4, 5 around the current microscope working distance and stigmator settings. The current microscope working distance and stigmator settings would result in an image 6 with the current microscope working distance and stigmator settings. The current microscope working distance and stigmator settings can be represented by a setting vector $F=[f_{wd}, f_{stigx}, f_{stigy}]$.

In FIG. 2, the first image 2 has a positive working distance perturbation 4, wherein the second image 3 has a negative working distance perturbation 5, the perturbations 4, 5 being denoted with $\pm\sigma_{wd}$. The perturbations 4, 5 lead to an asymmetry with respect to the sharpness of the images 2, 3.

The method according to the invention first captures the first image 2 and the second image 3 which form the basis for the subsequent method steps.

According to the method, n subareas 7, 9 of the first image 2 and n subareas 8, 10 of the second image 3 are selected, with $n \geq 1$, and wherein an i-th subarea 7, 9 of the first image 2 and an i-th subarea 8, 10 of the second image 3 form an i-th input patch pair, $1 \leq i \leq n$.

In FIG. 2, only two subareas for each image 2, 3 are shown as an example. However, preferably many subareas are selected from the images 2, 3.

Preferably, some or all subareas of one image 2, 3 are overlapping.

In FIG. 2, preferably the first subarea 7 of the first image 2 and the first subarea 8 of the second image 3 form a first input patch pair, and preferably the second subarea 9 of the first image 2 and the second subarea 10 of the second image 3 form a second input patch pair.

The image patch pairs form the input data for the processing step, wherein based on each i-th image patch pair a correction term $\Delta F_i$ 12 to the current working distance and stigmator setting is estimated.

The processing step is carried out by a processing unit 11, wherein preferably the processing unit 11 comprises at least one processor 13 and a memory 14, wherein preferably the memory 14 is coupled to the at least one processor 13 and the memory being designed to store processor-executable commands which, the commands being executable by the at least one processor 13. In particular, the at least one processor 13 may be at least one of a CPU or a CPU and a GPU.

Particularly preferable, the processing step is carried out by the use of a machine-learning modeling method, wherein further preferably the machine-learning modeling method is a deep learning method, the machine-learning method being trainable by training data.

As on output of the processing step, a correction term $\Delta F_i$ for each of the image patch pairs is obtained, wherein all the correction terms $\Delta F_i$ are combined by a function, the output of the function being the output correction term $\Delta F$. The output correction term comprises of a correction to the working distance and the stigmators, $\Delta F=(\Delta_{wd}, \Delta_{stigx}, \Delta_{stigy})$.

Subsequently, the output correction term is applied to the current working distance and the stigmator settings, thereby correcting the current settings.

More preferably, in order to improve the overall result of the method, the method steps are repeated at least once, and the method is stopped or terminated when a termination condition is met.

Preferably, the termination condition may be an absolute difference between the current working distance and stigmator settings and the adjusted working distance and stigmator settings with the absolute difference smaller than a first threshold; or wherein preferably the termination condition is a sharpness indication indicating a sharpness of the image with the sharpness indication exceeding a second threshold; or after a predefined number of repetitions of method steps.

After adjusting the working distance and the stigmator settings, the result is a focused or in-focus image 15.

To assess the model, the modeling method has been trained by a training method, wherein the training method comprises the steps of i) capturing an in-focus image with known working distance and stigmator settings;

ii) for k out-of-focus parameter settings, storing the parameter settings and the set of perturbed test images (e.g. two for each out-of-focus parameter setting in the case of antisymmetric perturbation of the working distance);

iii) repeating steps i) and ii) for different subareas of the sample j times, generating a total of j times k image pairs used as training input to the model together with the known out-of-focus parameters as the target;

iv) processing and comparing the correction terms to the known working distance and stigmator settings and obtaining a comparative error, and, depending on the comparative error, adjusting the machine-learning modeling method settings iteratively where every iteration uses only a subset of the j times k training samples.

The training method is briefly shown in FIG. 3.

To assess different subareas of the sample, the sample is moved in the x-direction and y-direction to capture different areas of the sample. Preferably, the sample areas are different to each other. Also preferably, the areas are at most partially overlapping.

The working distance and stigmator settings (parameters i) or values of the focused or in-focus image are changed by adding uniformly and independently sampled deltas $\Delta_i \sim U(a_i, b_i)$ to generate a set of distorted images together with the corresponding target values. More specifically, $-\Delta_i$ being the target value for each parameter, that leads back to the in-focus image setting.

As an example, to train the modeling method, the method has been trained for about 44 hours on a single GPU on a set of 32 sample locations with different aberration parameters, in total n=32*10=320 input image pairs, wherein 10 is the number of aberration parameters.

The model has been tested on location-aberration image pairs that were not part of the training data. The method for autofocusing rapidly converges toward the target ΔF values within three iterations, as can be seen in FIGS. 4A (convergence plot) and 4B (initial image with the current settings on the left side, autofocused image on the right side), even for low signal-to-noise (SNR) ratio image pairs, as can be seen in FIG. 4C (convergence plot) and 4D (initial image with the current settings on the left side, autofocused image on the right side), and small input patches, as indicated in FIG. 4B by the small square.

In particular, FIG. 4A shows the convergence plot where each parameter update was calculated as the mean of N predictions with a patch shape of 2×H×W, H being the height and W being the width in pixels taken from the two perturbed images, using 5×2×512×512 input patches and 200 ns pixel dwell time. The Y-axis shows the remaining difference to the initial focus values (dashed and dotted horizontal lines indicate 0.25 and 1 μm margin of stigmator and working distance after each iteration with an initial aberration of 30 μm, +6, −6 (wd, stig x, stig y). The input image size was 1024×768 pixels. Numbers in the top right of the example images indicate the iteration count. The SNR was calculated relative to the final focus image after iteration 10. The image acquired with the initial aberrations and after applying the method is shown in FIG. 4B. Scale bar is 1 μm.

FIGS. 4C and 4D are the same as in FIGS. 4A and 4B, but with 50 ns pixel dwell time.

Also, the impact of input alignment has been examined and it was found that the model performs well also in the extreme case that the patches in an input pair did not share the same offset, but were chosen randomly. To quantify the error for a larger range of initial defocus (working distance) values, the remaining ΔF has been measured after the first iteration. As expected, stigmation values were stable, and the remaining working distance error was closer to the target values for smaller initial deviations. Apart from the ability of correcting image aberrations with high accuracy, a well performing auto-focus method should add as little as possible computational overhead over the test image acquisition times. Therefore, the processing time of the method to microscope image acquisition time for CPU-only and GPU-based inference has been compared and run directly on the microscope control computer. As an example for such a control computer, an Intel Xeon CPU E5-2609 v2 with 2.50 GHz and 4 threads and 16 GB RAM together with a NVIDIA T1000 has been used. GPU-based inference was about an order of magnitude faster than CPU-only processing, especially for larger input images patches. Importantly, processing times of the method according to the invention did not add substantial overhead, even for the little optimized CPU-only mode, which will allow widespread deployment of the algorithm to standard microscope computers without hardware modifications.

In FIG. 5, a ratio of mean auto focus processing time per input patch-pair to imaging time of the two input images (2×220 ms at 1024×768, 200 ns dwell time) for different patch side lengths (output correction term and standard deviation. of 10 repetitions and 5 input patches) on the microscope PC. Error bars show the uncorrected standard deviation (s.d.).

However, during the development of the invention, it was noticed that many specimen contain regions with little usable information for an auto-focus algorithm, such as blood vessels in tissue, which show only blank epoxy resin, but no contrast that could be used by an autofocus method and thereby lead to suboptimal results, as shown in FIGS. 6A and 6B.

It was reasoned that these areas should have less weight in any auto focus determination, which was realized by incorporating the i-th weighting factor into the architecture that leads to a new set of outputs of the method to independently weigh each auto focus estimate.

These new outputs are loosely regularized scores that are used as weighting factors already during machine-learning model training.

The new output can be expressed by $\Delta F_i = (\Delta_{i,wd}, \Delta_{i,stigx}, \Delta_{i,stigy}, s_i)$.

Two different granularities for weighting have been tested, first on the level of the input image patches, that are the crops of the larger input image pair acquired by the microscope. The crops together with the weight or score are shown in FIG. 6C.

Figure 6D:
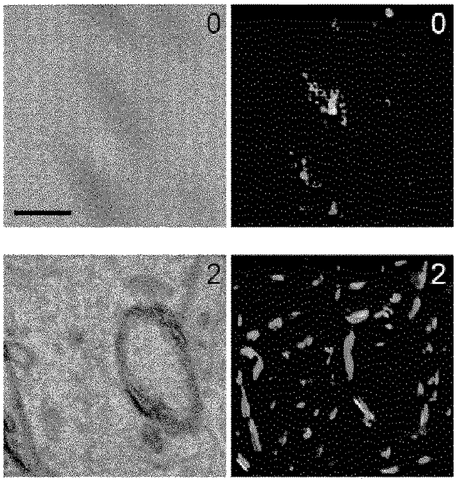

Secondly, on the level of individual pixels, leading to a scoring of every location in an input image, as shown in FIG. 6D. FIG. 6D shows a score map of one example patch. The left column shows an example input patch and the right column shows the corresponding pixel scores at iteration 0 and 2. Scale bar shows 0.5 μm in.

Both approaches were more robust toward specimen regions with little contrast information, illustrating that the method according to the invention does not require conventional image processing to prefilter low contrast regions.

To test to which degree the method according to the invention suffers from overfitting to its remarkably small training set, it was evaluated first on unseen samples and second on an entirely different microscope, with different imaging settings.

Surprisingly, the method according to the invention generalized almost perfectly to novel samples, even when trained only on image data of a single specimen, as presented in FIGS. 7A and 7B. However, it may be the case that a transfer to a different microscope setup with vastly different imaging settings, such as landing energy, beam current, overall working distance range, rotated image acquisition, may lead the method according to the invention to failure and divergence, as shown in FIG. 7C. However, a fine-tuned method according to the invention on the different microscope setup converges, as shown in FIG. 7D.

Therefore, a method for generating training data for a machine-learning modeling model is presented, which is independent on the microscope setup and the microscope settings.

It is noted that when the original model is applied on a new setup its correction output can instead also be transformed into the coordinate frame of the new setup, preferably without additional retraining.

Method for generating training data of a machine-learning modeling model used for a microscope setup, in particular an electron microscope, is proposed, wherein the method is independent of the microscope setup and microscope settings, the microscope being at least adjustable in microscope parameters a working distance, a stigmator in a x-direction and a stigmator in a y-direction, the method comprising the steps:

a) capturing a single in-focus image of a sample with reference working distance and stigmator settings, and assigning a first score value to the single in-focus image, the first score value representing a sharpness of the in-focus image;

b) for a L-th location of the sample, with L=1, generating N out-of-focus images to obtain corresponding score values for each of the out-of-focus images and obtaining a directed correction term by using an optimization method;

c) adjusting the working distance and stigmator settings of the L-th location of the sample by applying the directed correction term to the working distance and stigmator settings and obtaining a new image with corresponding new working distance and stigmator settings and a score value associated to the obtained image;

d) obtaining a directed correction term from the optimization method using the score value and the new working distance and stigmator settings;

e) repeating steps c)-d) until the score value of the obtained image is below or substantially equal to the first score value to obtain reference working distance and stigmator settings;

f) Based on obtained reference working distance and stigmator settings, acquiring M out-of-focus image pairs together with the out-of-focus parameters;

g) changing the L-th location of the sample by moving the sample in x-and y-direction;

h) repeating the steps b)-g) with incrementing L with every repetition.

According to the method for generating the training data, images are obtained based on a movement of the sample only in x-direction and y-direction.

Using such a method for generating new training data for a different microscope setup, a new minimal training dataset was created, for n=10 locations corresponding to 31% of the original training set for a microscope setup where the method according to the invention had diverged. Model fine-tuning (recalibration) has been performed in a reasonable short time interval; for example, in one example, fine-tuning took less than 2 hours on a single GPU, and restored the ability to estimate ΔF with the original convergence speed, as shown in FIG. 7D.

All the features disclosed in the application documents are claimed as being essential to the invention if, individually or in combination, they are novel over the prior art.

Reference List

1 microscope setup
1' sample
1" sample holder
2 first image
3 second image
4 first perturbation
5 second perturbation
6 image with current working distance and stigmator settings
7 first subarea of the first image
8 first subarea of the second image
9 second subarea of the first image
10 second subarea of the second image
11 processing unit
12 output correction term
13 function of all correction terms
14 memory
15 focused image

The invention claimed is:

1. A method for automatic focusing and astigmatism correction for a microscope, the microscope comprising a processing unit having at least one processor and a memory able to store processor-executable commands, and the microscope being at least adjustable in microscope parameters a working distance, a stigmator in a x-direction and a stigmator in a y-direction, the method comprising the steps:

a) capturing a first image of a sample with a first working distance perturbation and capturing a second image of the sample with a second working distance perturbation around a current working distance and current stigmator settings;

b) selecting n subareas of the first image and n subareas of the second image, where n≥1, wherein an i-th subarea of the first image and an i-th subarea of the second image form an i-th input patch pair, where 1≤i≤n;

c) processing each i-th input patch pair and receiving an i-th correction term comprising a correction to the current working distance, stigmator in x-direction and stigmator in y-direction;

d) receiving an output correction term as a function of all the correction terms;

e) adjusting the current working distance and stigmator settings by applying the output correction term to the current working distance and stigmator settings, wherein steps a)-e) are performed by the processing unit of the microscope.

2. The method according to claim 1, wherein the correction term comprises a correction direction.

3. The method according to claim 1, wherein sizes of the i-th subarea of the first image and the i-th subarea of the second image are substantially identical.

4. The method according to claim 1, wherein a position of the i-th subarea of the first image with respect to the first image is either substantially identical or different to the i-th subarea of the second image with respect to the second image.

5. The method according to claim 1, wherein the output correction term is a return value of a function.

6. The method according to claim 5, wherein the function combines all the correction terms into the output correction term.

7. The method according to claim 1, wherein the method steps a)-e) are repeated at least once, and the method is stopped when a termination condition is met or after a predefined number of repetitions of method steps a)-e).

8. The method according to claim 7, wherein the termination condition is an absolute difference between the current working distance and stigmator settings and the adjusted working distance and stigmator settings with the absolute difference smaller than a first threshold, or wherein the termination condition is a sharpness indication indicating a sharpness of the image with the sharpness indication exceeding a second threshold.

9. The method according to claim 1, wherein the i-th subarea of the first image and the (i+1)-th subarea of the first image are partially overlapping.

10. The method according to claim 1, wherein step c) is carried out by the processing unit using a machine-learning modeling method with machine-learning modeling method settings.

11. The method according to claim 10, wherein the machine- learning modeling method weights each i-th input patch pair with an i-th weighting factor, the i-th weighting factor depending on a machine-learning modeling model predicted importance of the i-th input patch pair on the output correction term.

12. The method according to claim 10, wherein the machine- learning modeling method is optimized by a training method by creating a set of training data.

13. The method according to claim 12, the training method comprising the steps of:

i) capturing an in-focus image with known working distance and stigmator settings;

ii) generating k out-of-focus image patch pairs, each image having known and different parameter settings;

iii) repeating steps i) and ii) for different subareas of the sample j times;

iv) processing and comparing the correction terms to the known working distance and stigmator settings and obtaining a comparative error, and, depending on the comparative error, adjusting the machine-learning modeling method settings.

14. The method according to claim 1, wherein the first perturbation and the second perturbation are either both positive perturbations or both negative perturbations, or the first perturbation is a positive perturbation and the second perturbation is a negative perturbation, and wherein an absolute value of the first perturbation and the second perturbation are i) identical; or ii) different to each other.

15. The method according to claim 1, wherein the microscope is an electron microscope.

16. A computing system comprising the processing unit having the memory coupled to the at least one processor and storing the processor-executable instructions that, when executed by the at least one processor, cause the processing unit to execute the method for automatic focusing and astigmatism correction according to claim 1.

17. A method for generating training data of a machine-learning modeling model used for a microscope setup, wherein the method is independent of the microscope setup and microscope settings, the microscope comprising a processing unit having at least one processor and a memory able to store processor-executable commands, and the microscope being at least adjustable in microscope parameters a working distance, a stigmator in a x-direction and a stigmator in a y-direction, the method comprising the steps:

a) capturing a single in-focus image of a sample with reference working distance and stigmator settings, and assigning a first score value to the single in-focus image, the first score value representing a sharpness of the in-focus image;

b) for a L-th location of the sample, with L=1, generating N out-of-focus images to obtain corresponding score values for each of the out-of-focus images and obtaining a directed correction term by using an optimization method;

c) adjusting the working distance and stigmator settings of the L-th location of the sample by applying the directed correction term to the working distance and stigmator settings and obtaining a new image with working distance and stigmator settings and a score value associated to the obtained image;

d) obtaining a directed correction term from the optimization method using the score value and working distance and stigmator settings from c);

e) repeating steps c-d) until the score value of the obtained image is substantially below or equal to the first score value from a) to obtain reference working distance and stigmator settings;

f) based on obtained reference working distance and stigmator settings by focusing the L-th location, acquiring M out-of-focus image pairs together with the out-of-focus parameters;

g) changing the L-th location of the sample by moving the sample in x-and y-direction;

h) repeating the steps b)-g) with incrementing L with every repetition, wherein steps a)-h) are performed by the processing unit of the microscope.

18. The method of claim 17, wherein the microscope is an electron microscope.

19. The method of claim 17, wherein the L * M images to form a set of training data.

20. A computing system comprising the processing unit having the memory coupled to the at least one processor and storing the processor-executable instructions that, when executed by the at least one processor, cause the processing unit to execute the method for automatic focusing and astigmatism correction according to claim 17.

* * * * *